(12) United States Patent
Baiocchi et al.

(10) Patent No.: US 7,126,193 B2
(45) Date of Patent: Oct. 24, 2006

(54) METAL-OXIDE-SEMICONDUCTOR DEVICE WITH ENHANCED SOURCE ELECTRODE

(75) Inventors: Frank A. Baiocchi, Allentown, PA (US); Bailey R. Jones, Mohnton, PA (US); Muhammed Ayman Shibib, Wyomissing, PA (US); Shuming Xu, Schnecksville, PA (US)

(73) Assignee: Ciclon Semiconductor Device Corp., Bethlehem, PA (US)

( * ) Notice: Subject to any disclaimer, the term of this patent is extended or adjusted under 35 U.S.C. 154(b) by 85 days.

(21) Appl. No.: 10/673,539

(22) Filed: Sep. 29, 2003

(65) Prior Publication Data

US 2005/0077552 A1    Apr. 14, 2005

(51) Int. Cl.
*H01L 31/119* (2006.01)

(52) U.S. Cl. .............. 257/343; 257/344; 257/335; 257/336; 257/288; 257/408; 257/409; 257/E29.017; 257/E29.121

(58) Field of Classification Search ............... 257/275, 257/343–344, 288–285, 408–409; 438/442, 438/142
See application file for complete search history.

(56) References Cited

U.S. PATENT DOCUMENTS

| | | | |
|---|---|---|---|
| 4,455,565 A | 6/1984 | Goodman et al. | |
| 5,155,563 A | 10/1992 | Davies et al. | |
| 5,252,848 A | 10/1993 | Adler et al. | |
| 5,841,166 A | 11/1998 | D'Anna et al. | |
| 5,869,875 A | 2/1999 | Hebert | |
| 5,907,173 A | 5/1999 | Kwon et al. | |
| 5,912,490 A | 6/1999 | Hebert et al. | |
| 5,949,104 A | 9/1999 | D'Anna et al. | |
| 6,001,710 A | 12/1999 | Francois et al. | |
| 6,215,152 B1 | 4/2001 | Hebert | |
| 6,372,557 B1* | 4/2002 | Leong | 438/142 |
| 6,521,923 B1* | 2/2003 | D'Anna et al. | 257/288 |
| 6,831,332 B1 | 12/2004 | D'Anna et al. | |
| 6,838,731 B1* | 1/2005 | D'Anna et al. | 257/343 |
| 2003/0218209 A1* | 11/2003 | D'Anna et al. | 257/335 |
| 2005/0017298 A1 | 1/2005 | Xie et al. | |

OTHER PUBLICATIONS

C.S. Kim et al., "Trenched Sinker LDMOSFET (TS-LDMOS) Structure for High Power Amplifier Application above 2 GHz", International Electron Devices Meeting Proceedings, 2001, pp. 40.2.1-40.2.4.
Wolf, Stanley, PhD. Multilevel-Interconnect Technology for VLSI and ULSI; Silicon Processing for the VSI ERA—vol. II: Process Integration; 1990; pp. 278-283; Lattice Press, Sunset Beach, CA.

* cited by examiner

*Primary Examiner*—Dung A. Le
(74) *Attorney, Agent, or Firm*—Duane Morris LLP

(57) ABSTRACT

An MOS device is formed including a semiconductor layer of a first conductivity type, a first source/drain region of a second conductivity type formed in the semiconductor layer, and a second source/drain region of the second conductivity type formed in the semiconductor layer and spaced apart from the first source/drain region. A gate is formed proximate an upper surface of the semiconductor layer and at least partially between the first and second source/drain regions. The MOS device further includes at least one contact, the at least one contact including a silicide layer formed on and in electrical connection with at least a portion of the first source/drain region, the silicide layer extending laterally away from the gate. The contact further includes at least one insulating layer formed directly on the silicide layer.

14 Claims, 2 Drawing Sheets

METAL-OXIDE-SEMICONDUCTOR DEVICE WITH ENHANCED SOURCE ELECTRODE

FIELD OF THE INVENTION

The present invention relates generally to semiconductor devices, and more particularly relates to techniques for improving high-frequency performance in a metal-oxide-semiconductor (MOS) device.

BACKGROUND OF THE INVENTION

Power MOS devices, including laterally diffused metal-oxide-semiconductor (LDMOS) devices, are employed in a variety of applications, such as, for example, power amplifiers in wireless communications systems. A conventional LDMOS device utilizes a multiple-level metal fabrication process for forming an interconnection between regions of differing conductivity types (e.g., n-type and p-type) in a source region of the device. The source current is then generally routed via a low resistance p-type region to the back of the wafer, where a source contact is formed.

In applications where high-frequency operation is desired, such as in a radio frequency (RF) range (e.g., above 1 gigahertz (GHz)), the conventional methodology for forming the LDMOS device results in a relatively high input capacitance Cgs (e.g., about 80 picofarad (pF) for a 50 micron device). The high input capacitance can cause a variety of undesirable effects, including device mismatching, narrow bandwidth, and low power gain. In order to minimize the input capacitance in the LDMOS device, a conventional approach has been to scale back the source contact area, thereby increasing a distance between the gate and the source interconnection of the device. While this approach may reduce the input capacitance of the LDMOS device, a source resistance Rs of the device is substantially increased due, at least in part, to the reduction in source contact area. In some cases, the increase in source resistance significantly undermines any beneficial reduction in the input capacitance provided by scaling back the source contact area.

Previous attempts to improve the high-frequency performance of the LDMOS device have primarily focused on optimizing the trade-off between input capacitance and source resistance. These prior attempts, however, have been unsuccessful at providing a CMOS process compatible LDMOS device capable of high-frequency operation. Accordingly, there exists a need for an LDMOS device capable of improved high-frequency performance which does not suffer from one or more of the above-noted deficiencies of the prior art. Furthermore, it would be desirable if such an LDMOS device was fully compatible with a CMOS process technology.

SUMMARY OF THE INVENTION

The present invention provides techniques for reducing an input capacitance of an MOS device without significantly impacting the source resistance of the device, thereby improving a high-frequency performance of the device. In an illustrative embodiment, when fabricating an LDMOS device, the techniques of the present invention advantageously eliminate the difficulties associated with using a dedicated metal layer to electrically connect an n+ region to a p+ region in a source region of the device, thereby significantly simplifying the process technology and improving device topology. Moreover, the techniques of the present invention can be used to fabricate an integrated circuit (IC) device, for example, an LDMOS device, using conventional CMOS-compatible process technology. Consequently, the cost of manufacturing the IC device is not significantly increased.

In accordance with one aspect of the invention, an MOS device is formed including a semiconductor layer of a first conductivity type, a source region of a second conductivity type formed in the semiconductor layer, and a drain region of the second conductivity type formed in the semiconductor layer and spaced apart from the source region. A gate is formed proximate an upper surface of the semiconductor layer and at least partially between the source and drain regions. The MOS device further includes at least one contact, the at least one contact including a silicide layer formed on and in electrical connection with at least a portion of the first source/drain region, the silicide layer extending laterally away from the gate. The contact further includes at least one insulating layer formed directly on the silicide layer. In this manner, the LDMOS device exhibits improved high-frequency performance, and is also substantially compatible with a CMOS process technology.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative CMOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to an MOS device comprising a novel source electrode which advantageously enables the MOS device to provide improved high-frequency performance. Moreover, the device is fully compatible with a CMOS process technology. Although implementations of the present invention are described herein with specific reference to an LDMOS device, it is to be appreciated that the techniques of the present invention are similarly applicable to other devices, such as, but not limited to, a vertical diffused MOS (DMOS) device, an extended drain MOS device, etc., with or without modifications thereto, as will be understood by those skilled in the art.

It is to be understood that the various layers and/or regions shown in the accompanying figures may not be drawn to scale. Furthermore, certain semiconductor layers may have been omitted for ease of explanation.

Figure 1:
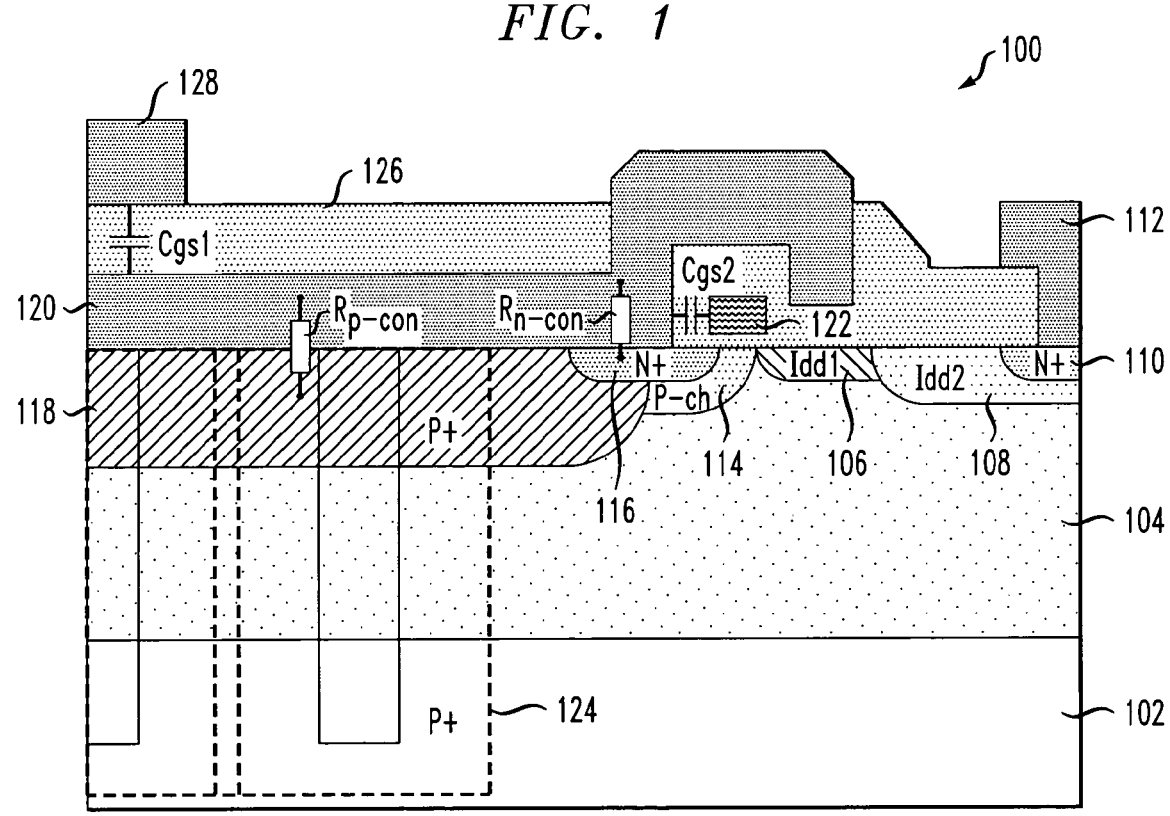
FIG. 1 is a cross-sectional view illustrating at least a portion of an LDMOS device in which the techniques of present invention can be implemented.

FIG. 1 illustrates a cross-sectional view of at least a portion of a semiconductor wafer 100. The wafer 100 includes an LDMOS device formed on a p+ substrate 102. The LDMOS device includes an n+ source region 116 and a drain region 110 formed in an epitaxial region 104 of the wafer 100. The LDMOS device further includes a gate 122 formed above a channel region 114 of the device. The channel region 114 is at least partially formed between the source and drain regions. A drift region is generally formed in the epitaxial layer 104 of the LDMOS device which may comprise a first lightly-doped drain (LDD) region (ldd1) 106 and a second LDD region (ldd2) 108 formed between the channel region 114 and drain region 110. The LDMOS device also includes a p+ region 118 formed in the epitaxial layer 104 which connects the p+ substrate to an upper surface of the wafer 100 via one or more trench sinkers 124 formed through the epitaxial layer 104. The trench sinkers 124 provide a low resistance (e.g., less than about 1 ohm per square) path between the substrate and the upper surface of the wafer. This p+ region 118 is connected to the n+ source region 116 by a dedicated metal layer 120.

The LDMOS device also includes a drain contact 112 electrically connected to the drain region 110, and a gate contact 128 electrically connected to the gate 122. Electrical contact to the source region 116 maybe made from a bottom of the substrate 102 by way of the trench sinkers 124. The metal layer 120 which is formed over at least a portion of the source region 116 and the p+region 118, for electrically connecting the n+ source region and p+ region, may also be formed over at least a portion of the gate 122 for shielding purposes. An oxide layer 126 is generally formed on an upper surface of the wafer to electrically isolate the source, drain and gate contacts of the device as well as to protect the device.

Due to the relatively close proximity of the metal layer 120, which is electrically connected to the source region 116, to the gate contact 128, a gate-to-source capacitance Cgs1 of the LDMOS device is formed which undesirably affects the high-frequency performance of the device. The gate shielding provided by the metal layer 120 helps reduce a capacitance between the gate and drain region which would otherwise improve the high-frequency performance of the device. However, a capacitance Cgs2 is formed as a result of the close proximity of the metal layer 120 to the gate 122, which further undesirably affects the high-frequency performance of the device. In order to reduce the capacitance Cgs2, the metal layer 120 is often scaled back from the source region 116 which increases the distance between the metal layer 120 and the gate 122. However, this reduces the source contact area resulting in a substantial increase in the source resistance Rs of the LDMOS device. As previously stated, in some cases, the increase in source resistance significantly undermines any beneficial reduction in the input capacitance Cgs2 provided by scaling back the source contact area.

Figure 2:
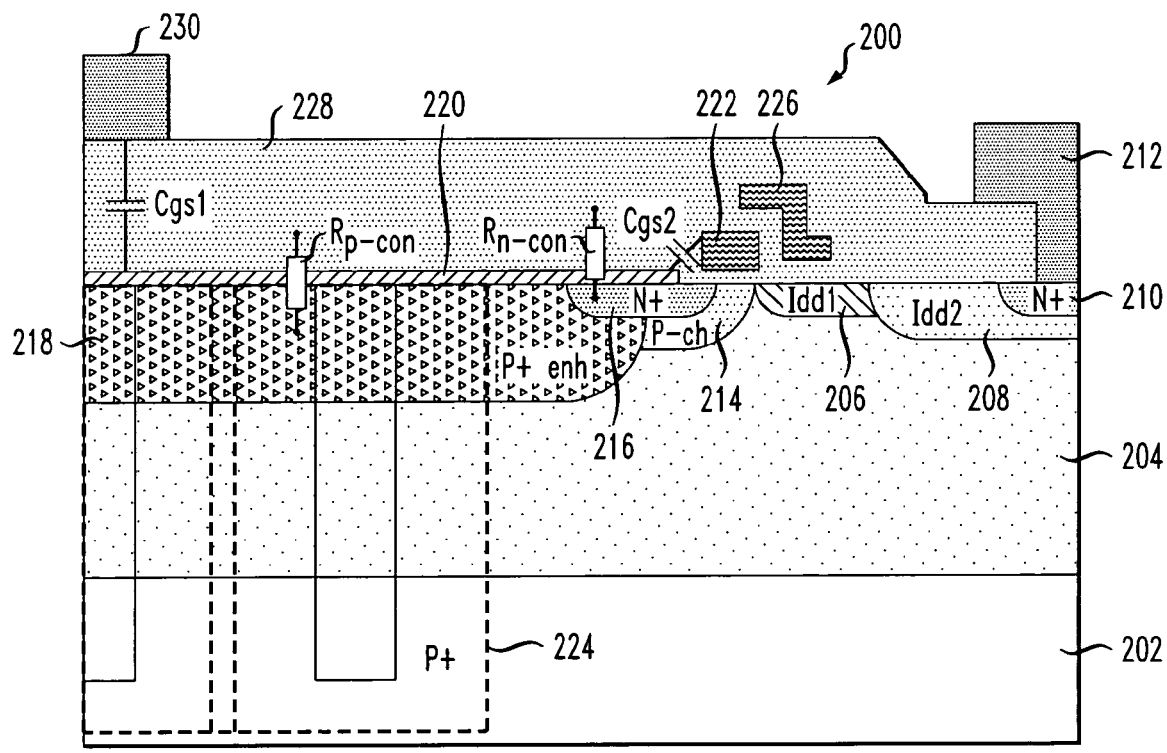
FIG. 2 is a cross-sectional view depicting at least a portion of an exemplary LDMOS device, formed in accordance with an illustrative embodiment of the invention.

FIG. 2 illustrates a cross-sectional view of at least a portion of a semiconductor wafer 200 in which the techniques of the present invention are implemented. As previously stated, the various layers and/or regions shown in the figure may not be drawn to scale and certain semiconductor layers may have been omitted for ease of explanation. The wafer 200 includes an exemplary LDMOS device formed on a semiconductor substrate 202. The substrate 202 is commonly formed of single-crystal silicon, although alternative materials may be used, such as, but not limited to, germanium (Ge), gallium arsenide (GaAs), etc. Additionally, the substrate may have been modified by adding an impurity or dopant, such as by a diffusion or implant step, to change the conductivity of the material (e.g., n-type or p-type). In a preferred embodiment of the invention, the substrate 202 is of p-type conductivity, and hence may be referred to as a p-substrate.

The term "semiconductor layer" as may be used herein refers to any semiconductor material upon which and/or in which other materials may be formed. The semiconductor layer may comprise a single layer, such as, for example, the substrate 202, or it may comprise multiple layers, such as, for example, the substrate 202 and an epitaxial layer 204. The semiconductor wafer 200 comprises the substrate 202, with or without the epitaxial layer 204, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

The exemplary LDMOS device includes a source region 216 and a drain region 210 formed in the epitaxial layer 204 of the wafer 200, such as by a conventional implant and diffusion process. The source and drain regions are preferably doped, such as by a conventional implant step, with an impurity of a known concentration level to selectively change the conductivity of the material as desired. Preferably, the source and drain regions 216, 210 have a conductivity type associated therewith which is opposite a conductivity type of the substrate 202, so that active regions can be formed in the device. In a preferred embodiment of the invention, the source and drain regions 216, 210 are of n-type conductivity. Electrical connection between the source region 216 and the substrate 202 may be provided by forming one or more trench sinkers 224 through the epitaxial layer 204 of the wafer 200. The trench sinkers may be formed in a conventional manner, such as, for example, by opening windows in the epitaxial layer 204 (e.g., by photolithographic patterning and etching) to expose the substrate 202, and filling the trenches 224 with a conductive material, as will be understood by those skilled in the art. In a preferred embodiment of the invention, the trench sinkers 224 are of p-type conductivity.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The exemplary LDMOS device may include a p+ region 218 formed in the epitaxial layer 204, such as by a conventional implant and diffusion process. The p+ region 218 is preferably formed adjacent to the source region 216 and extends laterally in a direction opposite the drain region 210. The p+ region 218 is preferably doped, such as by a conventional implant step, with an impurity of a known concentration level to selectively change the conductivity of the material as desired. Preferably, the p+ region 218 has a conductivity type associated therewith which is opposite a conductivity type of the source region 216.

A channel region 214 and a drift region, which may comprise a first LDD region (ldd1) 206 and a second LDD region (ldd2) 208, are formed in the exemplary LDMOS device. The channel region 214 is formed at least partially below and adjacent to the source region 216 while the drift region extends laterally from the channel region 214 to the drain region 210. The channel region 214 may be formed of a material having the same conductivity type as the substrate, preferably p-type in the exemplary LDMOS device, and may therefore be referred to as a p-channel. The drift region may be formed of material having the same conductivity type as the source and drain regions, preferably n-type, although the relative doping concentration of the drift region compared to the source and drain regions is typically lower.

The exemplary LDMOS device further includes a gate 222 formed above at least a portion of the channel region 214 and proximate an upper surface of the wafer 200. The gate maybe formed of, for example, polysilicon material, although alternative suitable materials (e.g., metal) may be similarly employed. A shielding electrode 226, which may be referred to herein as a dummy gate, may be formed in the exemplary LDMOS device at least partially between the gate 222 and the drain region 210. The dummy gate 226 is spaced laterally from the gate 222 and preferably non-overlapping relative to the gate. It is to be appreciated that the dummy gate 226 may be formed in virtually any configuration and/or shape that is substantially non-overlapping with respect to the gate 222, as will be understood by those skilled in the art. The dummy gate 226 is formed in close relative proximity (e.g., 200 nanometers (nm)) to an upper surface of the wafer 200. Although not shown, the dummy gate 226 in the exemplary LDMOS device, if used, is preferably electrically connected (i.e., strapped) to the source region 216.

The dummy gate 226 beneficially reduces a Miller capacitance Cgd between the gate and drain region of the LDMOS device, thereby improving the high-frequency performance of the device, and reduces hot-carrier induced (HCI) degradation in the device. A dummy gate suitable for use in conjunction with the present invention can be found in a related U.S. application Ser. No. 10/623,983 entitled "Shielding Structure for Use in a Metal-Oxide-Semiconductor Device" filed on Jul. 15, 2003, which is incorporated by reference herein.

Traditionally, a dedicated metal layer 120, which may comprise aluminum, gold, etc., is used to electrically connect the source region 116 (n-type) with the p+ region 118 of the device, as illustrated in FIG. 1. An important aspect of the present invention is that the exemplary LDMOS device is configured so as to eliminate this metal connection layer. Instead, electrical connection between the source region 216 and p+ region 218 is achieved via a silicide layer 220 formed over at least a portion of the source and p+ regions, such as by using a conventional deposition process. Suitable materials used to form the silicide layer 220 may include, for example, titanium, cobalt and tungsten, although essentially any material which is capable of forming a low-resistance (e.g., less than about one ohm per square) connection with the silicon may be used. As stated above, the silicide layer 220 is used in place of the metal layer 120 (see FIG. 1) for conducting current between the source region 216 and p+ region 218 of the LDMOS device.

Figure 3:
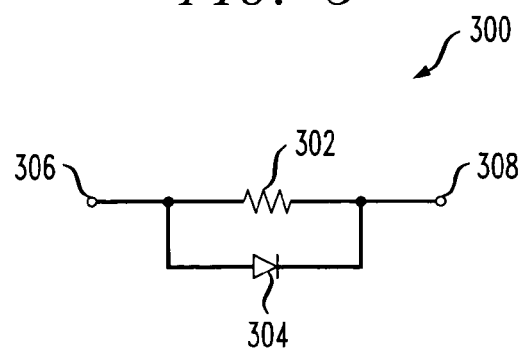
FIG. 3 is a schematic diagram illustrating a circuit representing a simplified electrical model of the source region of the exemplary LDMOS device depicted in FIG. 2.

FIG. 3 is a schematic diagram illustrating a circuit 300 representing a simplified electrical model of the source region of the exemplary LDMOS device depicted in FIG. 2. The circuit 300 includes a resistor 302 representing the silicide layer 220 in the exemplary LDMOS device and a diode 304 representing an active p-n junction formed by the p+ region 218 and the n+ source region 216 in the device. An anode of diode 304 is formed by the p+ region 218 and a cathode of the diode is formed by the n+ source region 216. A first terminal 306 of the circuit 300 represents the upper surface of the p-substrate and a second terminal 308 represents the channel region 214 of the device. The importance of the silicide layer 220 thus becomes apparent, since the silicide layer serves as a low-resistance path for current in the LDMOS device which by-passes the p-n junction formed by the p+ region 218 and source region 216. It is to be appreciated that substantially all of the source current passes through the silicide layer 220, and therefore the silicide layer is preferably designed to handle this current without exhibiting an appreciable resistance.

With continued reference to FIG. 2, because the silicide layer 220 is preferably formed as a relatively thin layer (e.g., about 0.05 to about 0.1 micron), at least in comparison to the metal layer 120 associated with the LDMOS device illustrated in FIG. 1, the distance between the silicide layer, which is electrically coupled to the source region 216, and a gate contact 230 formed proximate an upper surface of the wafer 200 above at least a portion of the p+ region 218, is substantially increased, thereby advantageously reducing a first component Cgs1 of the overall gate-to-source capacitance. Furthermore, a second gate-to-source capacitance component Cgs2 associated with a side edge of the silicide layer 220 is significantly smaller compared to the side edge capacitance component associated with the metal layer 120 (see FIG. 1). As such, the silicide layer 220 may be placed in closer relative proximity to the gate 222 without significantly increasing the gate capacitance Cgs2. In this manner, the source contact area can be increased, thereby beneficially reducing the source resistance, without any significant increase in the gate capacitance.

The exemplary LDMOS device further includes an insulating layer 228 formed on at least a portion of an upper surface of the wafer 200. The insulating layer 228 functions, at least in part, to protect the wafer 200 and to electrically isolate two or more conductive regions of the LDMOS device. The insulating layer 228 may comprise an oxide, for example, silicon dioxide (SiO$_2$), although alternative materials may be used for forming the insulating layer. It is to be appreciated that the insulating layer 228 may comprise a multiple-layer structure. Furthermore, the insulating layer 228 may include one or more conductive layers, as long as each of the conductive layers is electrically isolated from the silicide layer 220. For example, the insulating layer 228 may include a first oxide layer (e.g., SiO$_2$) formed directly on the silicide layer 220, a conductive layer (e.g., aluminum) formed on the first oxide layer, and a second oxide layer (e.g., SiO$_2$) formed on conductive layer, thus forming multiple-layer sandwich structure (not shown).

In addition to the improvements in high-frequency performance achieved by the LDMOS device formed in accordance with the techniques of the present invention, the elimination of the metal layer 120 electrically connecting the p+ and source regions of a traditional LDMOS device simplifies the semiconductor fabrication process, thereby reducing the cost of manufacturing the LDMOS device. Moreover, a topology of an upper surface of the LDMOS formed in accordance with the present invention is significantly more planar in comparison to the topology of the upper surface of a conventional LDMOS device employing metal layer 120. Consequently, the LDMOS formed in accordance with the present invention will advantageously exhibit an improved reliability over conventional LDMOS devices.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:
   a semiconductor layer of a first conductivity type;
   a first source/drain region of a second conductivity type formed in the semiconductor layer;
   a second source/drain region of the second conductivity type formed in the semiconductor layer and spaced apart from the first source/drain region;
   a gate formed proximate an upper surface of the semiconductor layer and at least partially between the first and second source/drain regions; and
   at least one contact, the at least one contact comprising:
   a silicide layer formed on and in electrical connection with at least a portion of the first source/drain region, the silicide layer extending laterally away from the gate; and
   at least one insulating layer formed directly on the silicide layer;
   wherein the first source/drain region comprises an n-type region and a p-type region formed adjacent to said n-type region and extending laterally away from said gate, and wherein the silicide layer is formed substantially proximate the n-type and p-type regions such that the silicide layer forms a substantially low-resistance electrical path in parallel with an electrical path formed between the n-type and p-type regions.

2. The device of claim 1, wherein substantially all current associated with the first source/drain region passes through the silicide layer in a direction from the n-type region to a p-type region that is proximate the upper surface of the semiconductor layer.

3. The device of claim 1, wherein the at least one insulating layer comprises at least one conductive layer, the at least one conductive layer being electrically isolated from the silicide layer.

4. The device of claim 1, wherein the silicide layer forms a substantially low-resistance electrical path for conducting current between two or more regions in the semiconductor layer that are electrically isolated from the device.

5. The device of claim 1, further comprising a shielding structure formed proximate the upper surface of the semiconductor layer and between the gate and the second source/drain region, the shielding structure being electrically connected to the first source/drain region, the shielding structure being spaced laterally from the gate and being substantially non-overlapping relative to the gate.

6. The device of claim 1, wherein the first source/drain region comprises a source region and the second source/drain region comprises a drain region.

7. The device of claim 1, wherein the device comprises a diffused MOS (DMOS) device, the first source/drain region comprises a source region and the second source/drain region comprises a drain region.

8. The device of claim 7, wherein the MOS device comprises a lateral DMOS (LDMOS) device.

9. An integrated circuit (IC) device comprising a plurality of metal-oxide semiconductor (MOS) devices, at least one of the MOS devices comprising:
   a semiconductor layer of a first conductivity type;
   a first source/drain region of a second conductivity type formed in the semiconductor layer,
   a second source/drain region of the second conductivity type formed in the semiconductor layer and spaced apart from the first source/drain region;
   a gate formed proximate an upper surface of the semiconductor layer and at least partially between the first and second source/drain regions;
   an implant region having a conductivity opposite the first source drain/region having a region proximate the upper surface of said semiconductor layer and extending laterally away from said gate; and
   at least one contact, the at least one contact comprising:
   a silicide layer formed on and in electrical connection with at least a portion of the first source/drain region, the silicide layer extending laterally away from the gate; and
   at least one insulating layer formed directly on the silicide layer;
   wherein substantially all current associated with the first source/drain region passes through the silicide layer in a direction from the first source/drain region to said implant region.

10. The IC device of claim 9, wherein the first source/drain region comprises an n-type region and the implant region comprises a p-type region, and wherein the silicide layer is formed substantially proximate the n-type and p-type regions such that the silicide layer forms a substantially low-resistance electrical path in parallel with an electrical path formed between the n-type and p-type regions.

11. The IC device of claim 9, wherein the at least one insulating layer comprises at least one conductive layer, the at least one conductive layer being electrically isolated from the silicide layer.

12. The IC device of claim 9, further comprising a shielding structure formed proximate the upper surface of the semiconductor layer and between the gate and the second source/drain region, the shielding structure being electrically connected to the first source/drain region, the shielding structure being spaced laterally from the gate and being substantially non-overlapping relative to the gate.

13. The IC device of claim 9, wherein the device comprises a diffused MOS (DMOS) device, the first source/drain region comprises a source region and the second source/drain region comprises a drain region.

14. The IC device of claim 9, wherein the silicide layer forms a substantially low-resistance electrical path for conducting current between two or more regions in the semiconductor layer that are electrically isolated from the device.

* * * * *